United States Patent [19]

Noble et al.

[11] Patent Number: 4,989,067
[45] Date of Patent: Jan. 29, 1991

[54] HYBRID INTERCONNECTION STRUCTURE

[75] Inventors: Milton L. Noble, Liverpool; Albert F. Milton, Syracuse; Darrel W. Endres; Douglas W. Dietz, both of Liverpool, all of N.Y.

[73] Assignee: General Electric Company, Syracuse, N.Y.

[21] Appl. No.: 374,932

[22] Filed: Jul. 3, 1989

[51] Int. Cl.$^5$ .............. H01L 23/48; H01L 29/44; H01L 29/52; H01L 29/60
[52] U.S. Cl. .............. 357/69; 357/68; 357/40; 357/30
[58] Field of Search .............. 357/69, 68, 30 G, 30 H, 357/30 D, 40, 19

[56] References Cited

U.S. PATENT DOCUMENTS 3,936,866  2/1976  Grossman et al. .............. 357/80
4,678,938  7/1987  Nakamura .............. 307/311

FOREIGN PATENT DOCUMENTS 59-19336  1/1984  Japan .............. 357/69
59-75656  4/1984  Japan .............. 357/19

OTHER PUBLICATIONS

Fujitsu Sci & Tech (Japan) vol. 16, No. 3 Sep. 1980, "HgCdTe Photoconductive Detector Array", by Itoh et al. pp. 151–165.
IBM Tech. Disclosure Bulletin vol. 12, No. 10 3/70 pp. 1556–1558, "Interconnection of Arrays", by R. A. Laff.
IEEE Trans. on Electron Devices, vol. ED–14, No. 10, 10/67 pp. 705–709, "Planar Beam–Lead GaAs Electroluminescent Arrays", by Lynch et al.

Primary Examiner—Andrew J. James
Assistant Examiner—Donald L. Monin
Attorney, Agent, or Firm—Richard V. Lang; Paul Checkovich; Fred Jacob

[57] ABSTRACT

A hybrid interconnection structure is disclosed having application to the fine pitch interconnection of delicate semiconductor chips. The invention entails the use of a beam lead interconnect in which patterned conductor runs are provided on the upper surface of a silicon chip. The conductor runs extend beyond the chip to form a paired set of beam leads. One set of beam leads makes contact with terminals on the upper surface of one chip and the other set of beam leads makes contact with terminals on the upper surface of another chip. The interconnect chip is set on a substrate common to the interconnected chips with its top surface slightly (normally less than 1-2 mils) above the top surfaces of the interconnected chips. This limits any downward deformation of the beam leads in the bonding process to insure reliability of the bond for fine pitch application. The invention has specific application to arrays of infrared detectors in which interconnections are provided between a delicate light sensing chip of mercury cadmium telluride or indium antimonide and more rugged readout integrated circuits, usually of silicon.

14 Claims, 3 Drawing Sheets

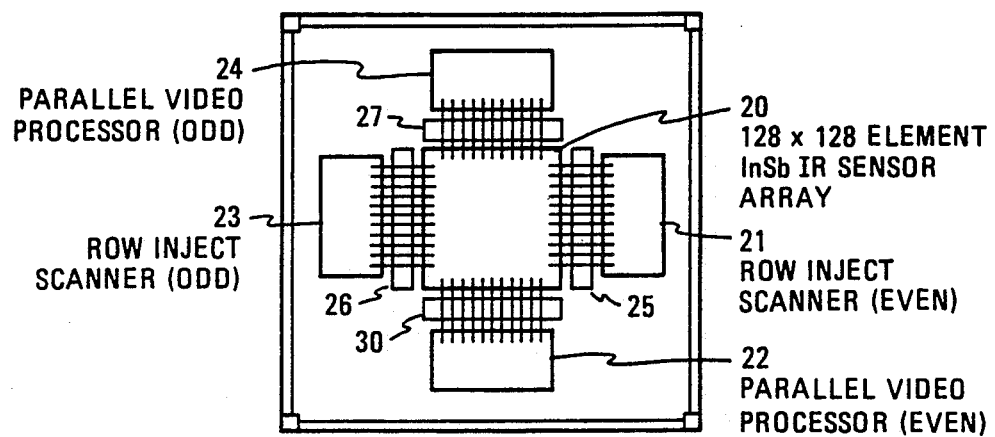
FIG. 2 FOCAL PLANE
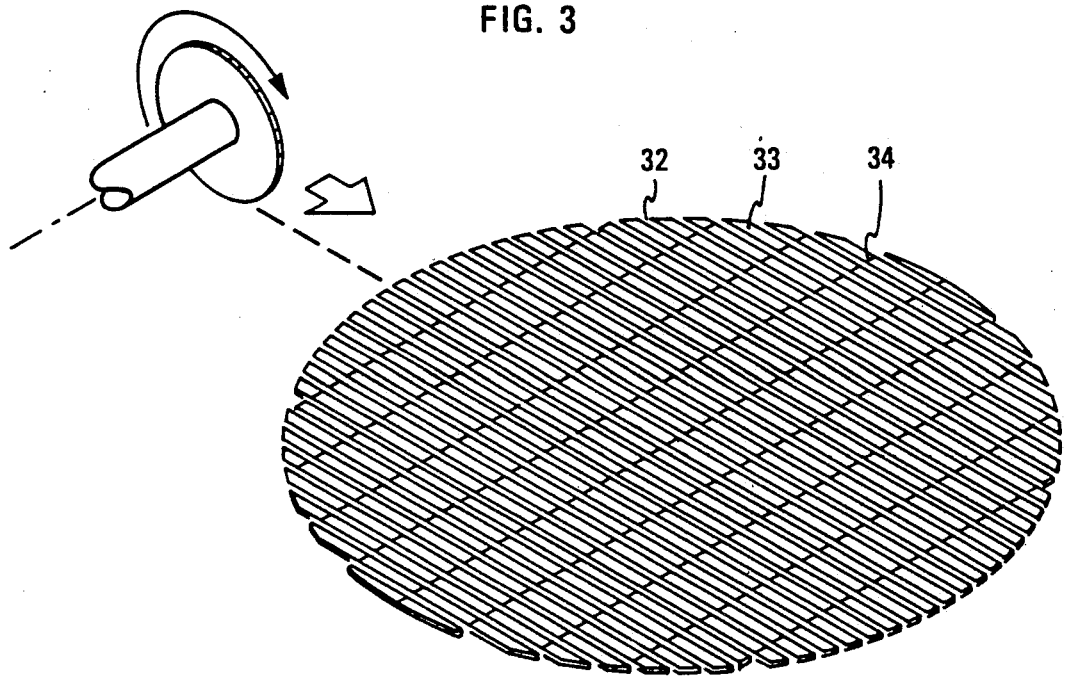
FIG. 3

4,989,067

HYBRID INTERCONNECTION STRUCTURE

BACKGROUND OF THE INVENTION

1. Field of the Invention

The invention relates to hybrid electronic circuitry by which is meant electronic circuitry partitioned into plural integrated circuits formed on separate chips and requiring further chip-to-chip interconnections for completion of the circuitry. The invention has application to the case where large numbers of chip-to-chip interconnections are to be made with a fine pitch and with delicacy to avoid injury to chips constituted of fragile semiconductor materials. The invention has special application to the focal planes of solid state cameras in which interconnections are provided between a delicate Mercury Cadmium Telluride (MCT) chip bearing an array of photosensors and more rugged silicon integrated circuits providing readout.

2. Prior Art

Wire bonds are the conventional method of interconnecting integrated circuits. In MCT chips bearing an array of photosensors, sensitive to infrared, they suffer from several limitations. The first limitation is a bonding pitch limitation of 2.5 mils (currently) in single level bonding. This limitation restricts wire bonding to hybridization of square arrays, line arrays and small depth time delay integration (TDI) arrays. Wire bonds cannot achieve the fine pitches required in TDI arrays 6 to 8 pixels deep, for which there is substantial demand. This is true even in arrays using large pixels, i.e., 3 mils×5 mils. Assuming that half the runs, of a 6 deep TDI array, are brought out on each of two sides of the array, the bonding pitch interval is 5 mils/3 = 1.67 mils. This application thus requires a more complex alternative two level bonding technique. The pitch requirements of an 8 deep TDI array, which are also of practical interest, are well beyond the capabilities of current wire bonding.

A second limitation with wire bonding is the damaging stresses exerted on delicate chips. The damage produced on relatively delicate MCT IR sensing chips by wire bonding ranges from catastrophic mechanical damage to minor reductions in detector performance. The bonding may produce physical damage to the bond pads and metallization runs on the MCT chip surface. Cracking and chipping of the underlying MCT chip may also occur. Additionally, even when there is little or no physical damage apparent on the surface of the chip, the bonding forces may produce internal stresses and damage to the detector crystal that results in degraded infrared sensing performance. To avoid this damage the bond pads are usually placed as far from the active photosensors as practical.

The more rugged silicon material is not equally subject to this kind of damage, and wire bonding as practiced with chips of silicon material is accordingly not well suited to bonding the more delicate semiconductor materials such as MCT, GaAs, InSb, etc.

A known interconnection technique for a delicate material which avoids wire bonding is the beam lead technique. It provides both freedom from bonding damage and a finer interconnection pitch interval than wire bonds can provide.

In this known interconnection technique, the metal runs from each pixel on the top surface of an MCT chip are extended and increased in thickness to form metal beams. Next the MCT chip is thinned from the back side and the MCT material directly under the metal beams is removed to form cantilevered beam leads. The under surface of the MCT chip is then bonded to the silicon readout chip.

The thinning of the MCT chip in this known technique permits the fine beam leads to traverse the substantial distance from the upper surface of the MCT chip to the bonding pads on the silicon readout chip coplanar with the lower surface of the MCT chip. The thinning of the MCT chip reduces the total length required of the beam lead, and reduces the amount of deformation required of the beam lead to effect the bond at the lower plane, thereby increasing the reliability of the interconnection.

This known technique avoids damaging forces on the MCT chip, but requires thinning the MCT chip to a few mils and requires subsequent handling of a very fragile chip with a consequent reduction in yield. The present approach seeks to improve over this known beam lead approach.

SUMMARY OF THE INVENTION

It is an object of the invention to provide an improved hybrid interconnection structure capable of providing large numbers of interconnections between integrated circuits.

It is still another object of the invention to provide an interconnection structure in which large numbers of interconnections may be provided between integrated circuits on a fine pitch interval.

It is an additional object of the invention to provide an interconnection structure in which large numbers of interconnections may be provided between integrated circuits with minimum thermal and/or mechanical stresses being exerted in formation of the bonds.

It is a further object of the invention to provide a novel interconnection structure suitable for use in the focal plane of a charge transfer device (CTD) camera or an array of photo diodes where connections at a fine pitch must be provided between a delicate light sensitive semiconductor chip and readout chips.

It is another object of the invention to provide an interconnection structure with large numbers of interconnections for use between two complex active integrated circuit chips which does not adversely impact the process yield of either chip.

These and other objects of the invention are achieved in a novel hybrid interconnection structure comprising a substrate, a first semiconductor chip typically of a delicate semiconductor material selected for its optical sensitivity, a second semiconductor readout chip usually of silicon, and a beam lead interconnect formed on a silicon chip. The beam lead interconnect chip has a plurality of patterned conductors maintained in rigid mutually spaced relation on its upper surface, each conductor run extending beyond the edges of the chip to form a first and second beam lead for bonding to adjacent chips.

All three chips have their undersurfaces supported on a common substrate, the beam lead interconnect chip being positioned between the first and second chips to permit their interconnection. The active circuitry and terminals of the first and second chips are placed on their upper surfaces, their upper surfaces being positioned just slightly (1 to 2 mils maximum) beneath the top surface of the beam lead interconnect chip.

The beam leads of the interconnect are then bonded to the terminals on the first and second chips.

The bonding process requires minimum deformation of the beam leads in the configuration described resulting in a reliable fine pitch interconnection and the bonding may be achieved with minimum thermal and mechanical stresses on delicate chips.

This novel bonding interconnection structure permits fine pitch bonding at less than 2.5 mils, which is the present practical limitation of conventional wire bonding. In particular, silicon beam lead interconnects herein described are capable of fractional mil pitches (e.g. 0.75 mil).

BRIEF DESCRIPTION OF THE DRAWINGS

The invention and distinctive features of the invention are set forth in the claims of the present invention. The invention itself, however, together with further objects and advantages thereof may best be understood by reference to the following description and accompanying drawings, in which:

FIG. 2 is an illustration of the focal plane of a Charge Transfer Device (CTD) camera in which four silicon beam lead interconnects are provided for connecting a pair of scanning and a pair of readout chips to a centrally placed optical detector array chip, each interconnect involving large numbers of individual connections;

FIG. 3 is an illustration showing the formation of plural interconnect chips from a single silicon wafer.

DESCRIPTION OF THE PREFERRED EMBODIMENT

Figure 1:
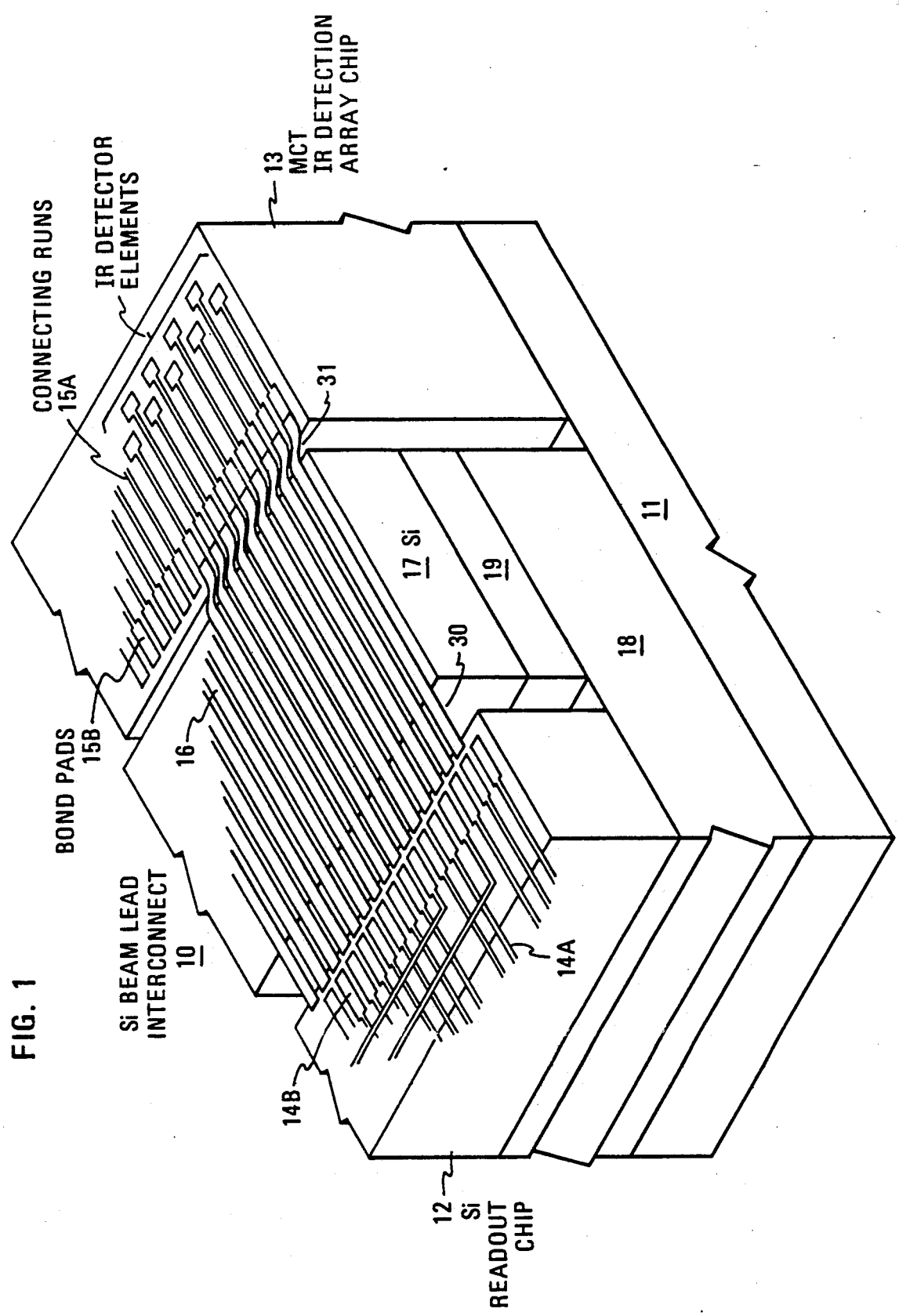
FIG. 1 is an isometric view of a silicon beam lead strip interconnect supported between and connecting a plurality of terminals on an infrared linear detector array to a like plurality of terminals on a silicon readout chip.

A silicon beam lead strip interconnect 10 is shown in FIG. 1 as part of a hybrid circuit. The interconnect is supported upon a hybrid substrate 11, typically alumina, which also supports a silicon integrated circuit readout chip 12 and an IR detector array chip 13 typically of mercury cadmium telluride (HgCdTe or MCT) or InSb. The chips 10 and 12, which are supported on the substrate 11 via shims 18, and 18 and 19 respectively, and the chip 13 make up the illustrated portion of the hybrid circuit.

The interconnect 10 provides a plurality of closely spaced connections between the silicon chip 12 and the MCT chip 13. In a typical case there may be between 64 and 256 connections at a 0.75 to 3 mil interconnection pitch. The typical width of the chip 17 for interconnect 10 may be from 20 to 40 mils and the typical length may be from 1/5 to ½ of an inch.

A larger system in which an interconnect of this nature finds application is in charge transfer device (CTD) (i.e. charge injection device (CID) or charge coupled device (CCD)) cameras, a "focal plane" for which is pictured in FIG. 2.

The interconnection problem for which the present interconnect provides a solution arises where a fine pitch is required or where a semiconductor chip to which contacts are to be made, is fragile. Fragility may be the result of the inherent weakness or brittleness of the semiconductor material or may result from excessive thinning of the chip, which may be required for the application. Compared to silicon, which is relatively robust, certain compound semiconductor materials such as gallium arsenide (GaAs), indium antimonide (InSb), and mercury cadmium telluride (HgCdTe) are fragile.

In the FIG. 2, two-dimensional array application of the invention, a focal plane of current design is shown including a square 128×128 element InSb IR detector array chip (or sensor) 20 which requires four interconnects to the four silicon processing chips (25, 26, 27 and 28) surrounding it. A current InSb array, sensor 20, is provided with 64 terminals at a 3.4 mil pitch spaced along each of its four sides. The silicon processing chips include an even row inject scanner 21 provided to the right of the array; an odd row inject scanner 23 provided to the left of the array; an odd column parallel video processor 24 provided along the upper edge of the array and; an even column video processor 22 provided along the bottom of the array. The ancillary integrated circuits 21, 22, 23 and 24 associated with the sensor array are conventionally silicon CMOS circuits. The IR sensor, however, is customarily one of the compound semiconductors having the fragility problem referred to above. While the 3.4 mil pitch dimensional requirement of the indicated arrangement may be easily accommodated with wire bonds, use of the four interconnects 25, 26, 27, and 28 of the type depicted in FIG. 1 is preferable.

Should higher density interconnects (i.e. <2.5 mil pitch) be required as in high density linear arrays or Time Delay Integration (TDI) arrays, conventional wire bonds are not applicable. The novel interconnect herein described is designed for applications requiring a 1.5 to 0.75 mil (or smaller) pitch.

In a TDI array, for instance, it is conventional to arrange two staggered sets of four or more rows along a common linear path. In the conventional TDI readout process, each staggered pair of rows is electrically scanned as the field of view of the array is mechanically scanned in space. The object of time delay integration processing is to improve the signal to noise ratio of the array by averaging the signals from separate detectors in each of the four rows. In other words, the signal from each (ith) photodetector element in the first row is summed with the signals from the corresponding (ith) photodetectors in the second, third and fourth rows as a point image passes across the array. These signals are mutually delayed, such that the photodetectors are pointed toward the same point in space and record substantially the same signal although at slightly later times, allowing the signal to be averaged in the interest of an improved signal to noise ratio.

The TDI array configuration forces the requirement for very dense interconnection. In an exemplary 4 deep, staggered element, linear array with a 3.0 mil pitch in the resolution direction (cross-scan direction), the staggered pairs of photodetectors are on 6 milli-inch centers. With single side connections to a 4 deep TDI array 8 separate detector element circuit runs must be interconnected in this 6 mil space which dictates a 6/8=0.75 mil interconnection pitch. The novel interconnect described herein is designed to provide interconnection at this high density.

Returning to a consideration of FIG. 1, the interconnect 10 provides a simple yet effective means for providing a large number of parallel connections between the two chips 12 and 13 making up the illustrated portion of a hybrid circuit.

The silicon readout chip 12 is shown at the left in the figure with an n-fold plurality of closely spaced conductor runs 14A and 14B arranged in parallel upon its upper surface. The conductor runs which extend toward but stop short of the right edge of the chip are finer as shown at 14A for point to point connections within the chip but expand into bonding pads as shown at 14B in the vicinity of the edge where bonding to the interconnect will take place. The chip 12, as earlier noted, is shown supported upon an alumina spacer block 18, which is in turn supported upon the substrate 11 of the focal plane array, also of alumina. The silicon chip 12 is nominally 20 mils thick and the spacer block is nominally 20 mils thick, bringing the upper surface of the chip 12 to a distance of 40 mils above the substrate.

The second MCT chip 13, is shown at the right in FIG. 1. The chip 13 is spaced from the silicon chip 12 by the distance required for insertion of the interconnect 10 between the two chips. The MCT chip is provided with a second n-fold plurality of closely spaced, bonding pads 15B, arranged upon its upper surface, with thinner internal conductor runs 15A extending toward the right. IR detector elements of a staggered-element linear array complete the right hand portion of the figure.

The same high density silicon beam lead interconnect (SBLI) is equally applicable to a 2D array (TDI, etc.). The MCT IR detector chip 13 is nominally 40 mils in thickness, a robust dimension permitted by use of the novel interconnect. The MCT chip is directly supported upon the substrate 11, bringing its upper surface to the same distance above the substrate as the upper surface of the chip 12, and to the correct elevation for use of the interconnect 10.

The interconnect 10 is dimensioned to fit between the silicon and the MCT chips and to provide a simple means for connecting each of the n bonding pads 14B on the silicon chip 12 on the left to each of the n bonding pads 15B on the MCT chip 13 on the right. To this end, the silicon chip 17 of the interconnect 10 is inserted in a position closely spaced between the two chips 12 and 13 and rigidly attached via shims 18 and 19 to the substrate 11.

The upper surface of the chip 17 supports an n-fold plurality of spaced conductor runs 16. The runs extend between the vertical boundaries of the underlying silicon chip 17 and they become self supporting beam leads 30 and 31 as they over extend the left and right chip boundaries respectively. The beam leads extend some 7 to 10 mils, the distance necessary to form bonds to the adjacent bonding pads 14B and 15B. The conductor runs 16 are held in rigid, mutually spaced, registration by virtue of their attachment to the upper surface of the silicon chip. The dimensions of the beam leads extending to either side of the chips are selected to maintain accurate registration and to insure mutual separation until they are bonded to the bonding pads. After bonding, registration and continued mutual separation of the free ends of the beam are insured by the bonds.

The top surface of the chip 17 is preferably slightly above the top surfaces of the chips 12 and 13 to allow insertion of the interconnect 10 into position between these chips without damaging the protruding beam leads. The excess elevation should be no more than 1 to 2 mils to limit the downward deflection of the beam leads 30, 31 as they are bent into contact with the underlying bonding pads 14B and 15B. A limitation of the deflection to this amount avoids excessive stress on the beam leads and increases the reliability of the bonds.

The chip 17 of the interconnect generally has a thickness of 10 to 15 mils, a value which represents a compromise between minimizing the processing time required for making the interconnect while still providing adequate structural support for the overall interconnection structure and for maintaining overall integrity against the stresses of handling. (As will be explained, the processing of the interconnect entails removal by chemical etching of a section of the silicon chip 17 underlying the beam leads. The process is shortened as the thickness of this silicon chip is reduced.) In the assembly, the 10 to 15 mil thick chip 17 is placed upon the spacer 19 which has a thickness of from 5 to 12 mils, which is in turn placed upon the 20 mil spacer 18. The thickness of the three members 17, 18 and 19 are selected to bring the upper surface of the chip 17 into the correct elevated position in relation to (i.e. 1–2 mils over) the upper surfaces of the chips 12 and 13.

The foregoing arrangement for a TDI IR sensor may involve 128 elements with a 1.5 mil pitch with the resulting interconnect having a length of about 200 mils. The preferred spacing between the three chips 17 and 12, and between 17 and 13 is 2 to 3 mils to insure ease in assembly and to permit beam leads of approximately 7 to 10 mils in length to cross the gap, and have an adequate overhang to form bonds.

Assuming pitch dimensions just described, the thickness of the elements making up the conductor runs 16 are about 5 microns, (or 0.2 mil) and the width is approximately 1.2 mils with 0.3 mil spacing between conductor runs. The preferred material is gold, formed in a manner optimizing ductility. In addition, an optional undercoating of indium in the interconnect region may be used to facilitate the lowest pressure bonding. As seen in FIG. 1, the beam leads 31 to the right are in a depressed position having been bonded to the bonding pads 15B while the beam leads 30 to the left are undepressed and in a position above the bonding pads 14B preparitory to bonding. The beam lead overhang over the adjacent chips 12 and 13 may be from 5 to 8 mils.

The bonding process and the finished bonds may be described with reference to FIG. 4. Here a pulse operated thermal compression bonding tool head (Type VTA 96 Hughes Industrial Products Co., Carlsbad, CA) is illustrated at 41. The tool head is held in a Hughes Model HPC-596 Light Forca PCB Repair Station altered to do thermocompression bonding. It is shown in the process of effecting three simultaneous beam lead bonds. The footprint of the device using a tip type EWB-25M is a 2×5 mil rectangle. The tool bonds the gold of the beam leads 30 on the interconnect 10 to the gold of the bonding pads on the adjacent silicon chip 12. The beam leads 31 on the interconnect have already been bonded to the bonding pads 15B on the adjacent MCT chip 13. Formation of the bonds occurs at a relatively low pressure aided by heat applied in a short pulse.

The amounts of pulsed heating and of tool pressure in bonding the present interconnects are set to be great enough to effect a reliable bond while at the same time low enough to avoid damage to the active device on the chips.

Short pulse heating creates the highest temperatures in the conductor runs where the bonding occurs and in the chip immediately under the bonds. The regions of the semiconductor body less proximate to the bonds are thus exposed to relatively lower temperatures. Pulsing allows the heat to be used sparingly with maximum effect at the bond and permits rapid dispersal of the heat by the thermally conductive conductor runs with a minimum increase in the thermal stresses exerted on the underlying semiconductor material.

Tool pressure in bonding the present interconnect is also adjusted to achieve a reliable bond; without causing unacceptably high localized stresses in the underlying semiconductor body.

The present interconnect uses a direct gold to gold thermal compression bond in which the quality of the bond depends upon tool pressure and temperature. With reference to the bonding mechanism, the term "diffusion bond" is frequently used. Gold, due to its status as a noble metal and its malleability is the normal material for this use. However, should it be desirable, the bonding pressure may be further reduced by adding a softer metal than gold—such as indium on the undersurface of the beam leads to effect the bonds. Here the bonding mechanism involves the formation of a solid solution, which is softer than gold. The gold beam leads may also be bonded to other than gold bonding pads, as for instance aluminum, which is often used as top surface pad metal on silicon ICs.

The disposition of indium by evaporation or electroplating on the undersurface of the beam lead in controlled amounts, allows formation of a reliable bond without increasing the width of the interconnection by lateral flow in the vicinity of the bonding pad. Thus the allowance for spacing between the conductor runs 16 and bonding pads 14B and 15B may remain small without reducing the reliability of the fine pitch interconnection.

The present novel arrangement in its use of shims under the chips and top surface connections between chips avoids thinning the fragile MCT chip, allowing it to have the thickness necessary to achieve the required mechanical strength. In the example, the MCT chip has a maximum thickness of 40 mils which may be somewhat larger or much smaller without comprising electrical performance or reliability. The result is substantial freedom from chip breakage due to the bonding process.

The novel beam lead interconnects have the advantage of permitting direct use of tested detector chips, with no further processing such as is required by other interconnection techniques. This prevents any reduction in yield that additional processing might cause.

In addition, the nearly coplanar hybrid structure in which the interconnect is set within a mil or two above the bonding pads, and in which the bonding pads are set a few mils away from the interconnects reduces the stresses in the beam leads, and increases the reliability of the interconnections.

The process of making the interconnects may be explained with reference to FIG. 3. The process, depending upon interconnect dimensions, produces on the order of 100 to 250 interconnect chips from a single 2" diameter silicon wafer. In the process the interconnects are formed from the wafer by etching grooves 32 between remaining elongated islands 33 from which the interconnect chips are formed. The grooves have a width equal to twice the length of a beam lead, plus the kerf of a wafer saw used to separate the individual strips. The elongated islands 33, have a width equal to that of the chips 17 of the interconnects. In the illustration, there are approximately 30 elongated islands 33, and the longest islands are cut at 34 into about ten sections with the shorter islands being cut into smaller numbers of sections. Thus, taking into account the circularity of the wafer boundary, one may expect approximately ⅔ of 300 or 200 interconnect chips from the exemplary wafer.

The silicon wafer surface must be of an <110> orientation to achieve properly etched grooves between interconnect strips. In addition, a reference flat is ground on the edge of the wafer parallel to a <111> plane of the crystal. Grooves and conductor runs are then oriented in relation to the flat, the grooves being parallel and the conductor runs perpendicular to the flat. These provisions help to insure that the grooves 32 etched between the columns 33, from which the interconnect chips are obtained, have flat and perpendicular walls.

The upper surface of the silicon wafer, upon which the conductor runs 16 are formed, is processed by first growing an insulative $SiO_2$ layer of greater than 1000 angstroms thickness. This is formed on the upper surface by a thermal $SiO_2$ growth or chemical vapor deposition (CVD) process. The upper $SiO_2$ layer provides an insulating underlayer for the conductor runs 16. The upper $SiO_2$ layer is then coated with a thin conductive metal layer by sputtering or evaporation. The primary constituent of the conductive metal layer is gold with a thin adhesion enhancing layer such as chromium, titanium, or titanium-tungsten underlying the gold. The gold metallization is continued until a thickness of from one to two thousand angstroms is reached. Should indium be employed to facilitate a lower pressure bond, a separate processing step may be added to evaporate or electro-plate indium in the beam lead bond region. Then the metallization, possibly topped with indium, is patterned with photoresist to form the beam lead pattern with a subsequent etch step. The silicon wafer is then electro-plated with gold to buildup the exposed metallic layer to 4 or 5 microns (approximately 0.2 mil). The plating process is preferably pulsed to allow a more laminar formation of the metallic gold and to increase its ductility.

As a second part of the interconnect formation process, the silicon wafer is etched from the under surface to form the grooves 32 which separate the islands 33 and which by removing underlying semiconductor material, define the lengths of the beam leads.

For the second part of the process, a $SiO_2$ etch masking layer is formed on the bottom surface of the wafer. This layer must be at least 1000 A thick, and is patterned by using a photo-resist etching pattern. After the $SiO_2$ layer patterned, the photo-resist is removed. The $SiO_2$ will cover the areas over future islands 33, and will be removed from the areas over future grooves 32.

After patterned removal of the $SiO_2$, the exposed silicon is preferentially etched with a wet etch until all of the silicon has been removed from the grooves exposing the final $SiO_2$ layer on the top surface of the wafer and immediately under the remaining conductor runs. The remaining $SiO_2$ layer and the adhesion enhancing layer (e.g. chromium) on the undersurface of the gold are then removed by a wet etch. In the event that indium has been used to enhance the bond, the gold layer beneath it will also be removed to expose the indium. The process leaves the plated gold forming the beam leads intact and preserves the indium pads at the ends of the beam leads for enhancing the subsequent bonds.

Next, the islands are sawn into sections having the lengths of the finished interconnects as shown at 34, and then the sections are separated by sawing the beam leads interconnecting them as illustrated in FIG. 3. At this point, the chips 17 have the desired final dimensions and the beam leads 30 and 31 have the desired final lengths with undersurfaces cleared for bonding. After final cleaning procedures, the beam lead interconnect chips are ready to use.

Figure 4:
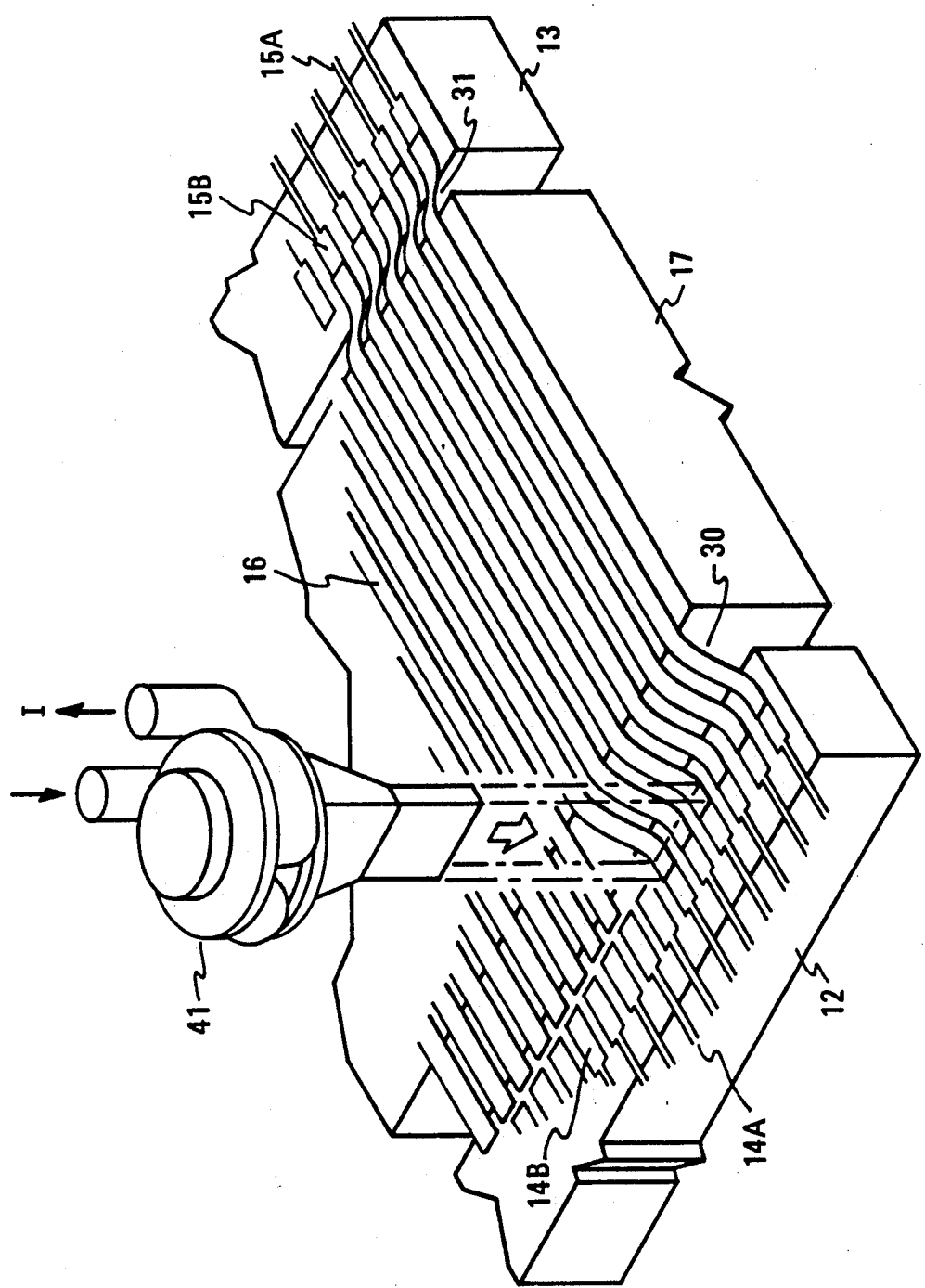
FIG. 4 is a diagram illustrating the gang bonding of individual beam leads of an interconnect to terminals on an adjoining chip.

The process of bonding of the interconnects in a hybrid arrangement is illustrated in FIG. 4. In FIG. 4, it is assumed that the three chips, the MCT chip 13, the silicon chip 12, and the silicon interconnect chip 17 have been previously attached to the alumina substrate 11 via the intermediate shims 18 and 19, and that the arrangement brings the upper surface of the interconnect slightly above the upper surfaces of the two chips being interconnected. The bonder earlier mentioned has a footprint of about 2×5 mils in a practical example and may be used to form several bonds simultaneously, i.e. gang bonding as illustrated.

The beam lead interconnect in accordance with the invention has been described in the context of use in a focal plane of an IR camera. The arrangement permits a very thin configuration in which the optical elements of the camera may be placed very close to the optically active detector array required for efficiency and eliminating the larger spacing that the 0.025 high loops of wire loops would require.

In IR systems where cold shielding at the pixel level is required, the cold shields can be attached to the top surfaces of the beam level interconnects which in comparison to wire loops, permits closer spacing of the cold shields.

The interconnect structure of the present invention may be distinguished from the prior art which has taught the use of metal beam leads (usually of aluminum), which are formed on active silicon IC's and are directly bonded or soldered to a metal pattern on a hybrid substrate. This known arrangement has been used in an application where a very coarse pitch is adequate.

The present interconnect structure may also be distinguished from the use of metal beam leads (usually of gold) formed on active MCT detector arrays, and then directly bonded (by thermal compression bonds, etc.) to a silicon multiplexer/readout chip or to metalized runs on a hybrid substrate. This known arrangement has been used in applications requiring a finer pitch.

The present invention may be distinguished from the above arrangements in its use of beam leads formed on a simple and inexpensive passive interconnect chip, which interconnects two relatively complex and costly active chips by bonding the beam leads to bonding pads on the active chips. The present interconnect structure not only permits a finer pitch capability than heretofor obtained, but has other advantages in simplified processing and increased yields.

The formation of beam leads, which are required to extend beyond a chip, as earlier described, requires substantial additional chip processing, as for instance the removal of the underlying chip. The additional processing is substantially more complicated than the formation of bonding pads on a chip which are a part of the normal conductor runs. Thus when the processing to form a beam lead is performed on the passive interconnect chip rather than on the active chips, further processing of the active chips is avoided. One should add that in the case of non-silicon active chips such as those of GaAs and the IR sensitive compound semiconductors, the processing for beam lead formation is not yet as simple as for silicon, for which the processing is mature and readily practiced. Finally, the bonding of the beam leads formed on the interconnect to conventional pads on the active chips is a low risk process, and the interconnection process may be completed without significant adverse affect on the process yield of the active chips.

Accordingly, beam lead interconnection, as disclosed herein, provides a simpler interconnection structure between two complex chips than previously proposed and one that is capable of pitches as fine as fractional (e.g. 0.75) mils.

What is claimed is:

1. A hybrid interconnection structure comprising in combination:
   (A) a substrate;
   (B) a first semiconductor chip having its undersurface supported upon said substrate, and having on its upper surface an integrated circuit and near an edge of said upper surface a first plurality of closely spaced terminals;
   (C) a second semiconductor chip having its undersurface supported upon said substrate at a position spaced from said chip and having on its upper surface an integrated circuit and near an edge of said upper surface a second plurality of closely spaced terminals oriented for sequential connection to said first plurality of terminals; and
   (D) a beam lead interconnect comprising a third chip of semiconductor material having its undersurface supported upon said substrate and having on its upper surface a plurality of patterned conductor runs maintained in rigid, mutually spaced relation, each conductor run extending beyond the edges of said third chip to form a first and a second beam lead of sufficient length for bonding to a terminal on an adjacent chip,
   said interconnect being supported upon said substrate at a position between said first and second chips with said beam leads and terminals in registration and in mutually bonded condition to sequentially interconnect said first and second pluralities of terminals.

2. The hybrid interconnection structure set forth in claim 1 wherein
   (1) at least one of said first and second chips contains active circutiry, and
   (2) said third chip contains only passive circuitry, said interconnect providing fine pitch interconnections between said first and second chips.

3. The hybrid interconnection structure set forth in claim 1 wherein
   (1) one of said first and second chips is an array of optical detectors, and the other of said first and second chips is a readout circuit, and
   (2) the pitch of said interconnections lie in the range of a fraction of a mil to several mils.

4. The hybrid interconnection structure set forth in claim 2, wherein
   the material of said third chip is silicon, having its upper surface slightly elevated above the upper surfaces of said first and second chips to limit downward deformation of said beam leads in forming bonds, and said beam leads are gold, processed for ductility to facilitate said deformation and enhance the reliability of said bonds when formed with minimum mechanical stress.

5. The hybrid interconnection structure set forth in claim 2 wherein
said beam leads are of a thickness of approximately 0.2 mil, a length of approximately 7 to 10 mils and a downward deformation when bonded, limited to less than two mils.

6. The hybrid interconnection structure set forth in claim 4 wherein
said beam leads have an underlying soft metallic layer to enhance the reliability of said bonds where formed with minimum mechanical stress.

7. The hybrid interconnection structure set forth in claim 6 wherein
said soft metallic layer is indium.

8. The hybrid interconnection structure set forth in claim 6 wherein
at least one said first and second chips is of a fragile semiconductor material.

9. The hybrid interconnection structure set forth in claim 8 wherein
said fragile material is a semiconductor of the class including GaAs, InSb, and HgCdTe.

10. The hybrid interconnection structure set forth in claim 8, wherein
said beam leads are bonded with non-vibratory, low pressure, pulsed thermal compression bonds to limit the temperature rise and thermal and mechanical stresses upon the underlying chips during bonding.

11. The hybrid interconnection structure set forth in claim 6 wherein
said patterned conductor runs and beam leads of said third chip are formed from a metallization of the upper surface of an extended silicon member, the edges of said member being chemically removed to form said chip, the portions of said metallization overhanging said chip forming self suppporting beam leads.

12. A hybrid interconnection structure as set forth in claim 2 wherein
said structure forms the focal plane of a charge transfer device camera,
said integrated circuit on said first chip is an optical array of photo sensors, and
the integrated circuit on said second chip is a readout circuit for connection to said optical array.

13. A hybrid interconnection structure as set forth in claim 12 wherein
said first chip is an optically sensitive semiconductor material of the class including InSb and HgCdTe.

14. A hybrid interconnection structure as set forth in claim 12 wherein
said integrated circuit is a linear time delay integration optical array.

* * * * *